(12) United States Patent
Zhao et al.

(10) Patent No.: US 10,571,344 B2
(45) Date of Patent: Feb. 25, 2020

(54) NANOTHERMOMETER

(71) Applicant: INSTITUT NATIONAL DE LA RECHERCHE SCIENTIFIQUE, Quebec (CA)

(72) Inventors: Haiguang Zhao, Montreal (CA); Alberto Vomiero, Ponte San Nicolo (IT); Federico Rosei, Montreal (CA)

(73) Assignee: INSTITUT NATIONAL DE LA RECHERCHE SCIENTIFQUE

( * ) Notice: Subject to any disclaimer, the term of this patent is extended or adjusted under 35 U.S.C. 154(b) by 169 days.

(21) Appl. No.: 15/329,285

(22) PCT Filed: Jul. 27, 2015

(86) PCT No.: PCT/CA2015/050703
§ 371 (c)(1),
(2) Date: Jan. 26, 2017

(87) PCT Pub. No.: WO2016/015146
PCT Pub. Date: Feb. 4, 2016

(65) Prior Publication Data
US 2017/0248477 A1    Aug. 31, 2017

Related U.S. Application Data

(60) Provisional application No. 62/029,769, filed on Jul. 28, 2014.

(51) Int. Cl.
*G01K 11/20* (2006.01)
*B82Y 15/00* (2011.01)
(Continued)

(52) U.S. Cl.
CPC .............. *G01K 11/20* (2013.01); *B82Y 15/00* (2013.01); *C30B 1/10* (2013.01); *C30B 29/48* (2013.01);
(Continued)

(58) Field of Classification Search
CPC .... G01K 11/20; G01K 2211/00; C30B 29/48; C30B 29/68; C30B 29/50; C30B 1/10;
(Continued)

(56) References Cited

U.S. PATENT DOCUMENTS 7,515,333 B1    4/2009  Empedocles
7,935,419 B1    5/2011  Hollingsworth et al.
(Continued)

FOREIGN PATENT DOCUMENTS

DE       102012203036 A1 *  8/2013  ........... C09K 11/565
WO       2013066630 A1     5/2013
WO       WO 2013066630 A1 *  5/2013  ........... C09K 11/562

OTHER PUBLICATIONS

Albers AE, Chan EM, McBride PM, Ajo-Franklin CM, Cohen BE, Helms BA. Dual-Emitting Quantum Dot/Quantum Rod-Based Nanothermometers with Enhanced Response and Sensitivity in Live Cells. Journal of the American Chemical Society 134, 9565-9568 (2012).

(Continued)

*Primary Examiner* — Lisa M Caputo
*Assistant Examiner* — Janice M Soto
(74) *Attorney, Agent, or Firm* — Lavery, De Billy, LLP; Beatrice Ngatcha

(57) ABSTRACT

There is provided a semiconductor nanocrystal or quantum dot comprising a core made of a material and at least one shell made of another material. Also there is provided a composite comprising a plurality of such nanocrystals or quantum dots. Moreover, there is provided a method of measuring the temperature of an object or area, comprising using a temperature sensor comprising a semiconductor nanocrystal or quantum dot of the invention.

18 Claims, 15 Drawing Sheets

(51) Int. Cl.
*G01K 7/00* (2006.01)
*C30B 29/60* (2006.01)
*C30B 29/48* (2006.01)
*C30B 1/10* (2006.01)
*C30B 29/50* (2006.01)
*C30B 29/68* (2006.01)

(52) U.S. Cl.
CPC .............. *C30B 29/50* (2013.01); *C30B 29/60* (2013.01); *C30B 29/68* (2013.01); *G01K 7/00* (2013.01); *G01K 2211/00* (2013.01); *Y10S 977/774* (2013.01); *Y10S 977/814* (2013.01); *Y10S 977/824* (2013.01); *Y10S 977/825* (2013.01); *Y10S 977/896* (2013.01); *Y10S 977/955* (2013.01)

(58) Field of Classification Search
CPC ........... C30B 7/00; C30B 29/60; B82Y 15/00; Y10S 977/896; Y10S 977/955; Y10S 977/774; Y10S 977/814; Y10S 977/824; Y10S 977/825
See application file for complete search history.

(56) References Cited

U.S. PATENT DOCUMENTS

| | | |
|---|---|---|
| 2009/0286257 A1 | 11/2009 | Shih et al. |
| 2010/0289003 A1* | 11/2010 | Kahen .................... C09K 11/02 257/14 |
| 2011/0226991 A1* | 9/2011 | Treadway .......... A61K 49/0067 252/301.6 S |
| 2012/0270231 A1 | 10/2012 | Smith et al. |
| 2013/0146141 A1 | 6/2013 | Pelton et al. |
| 2014/0158977 A1 | 6/2014 | Supran et al. |

OTHER PUBLICATIONS

Allison SW, Gillies GT. Remote thermometry with thermographic phosphors: Instrumentation and applications. Review of Scientific Instruments 68, 2615-2650 (1997).
Aswathy RG, Yoshida Y, Maekawa T, Kumar DS. Near-infrared quantum dots for deep tissue imaging. Analytical and Bioanalytical Chemistry 397, 1417-1435 (2010).
Bandic ZZ, Ikonic Z. Electronic structure of (Zn,Cd)(S,Se)-based polytype superlattices. Physical Review B 51, 9806-9812 (1995).
Barilero T, Le Saux T, Gosse C, Jullien L. Fluorescent Thermometers for Dual-Emission-Wavelength Measurements: Molecular Engineering and Application to Thermal Imaging in a Microsystem. Anal Chem 81, 7988-8000 (2009).
Battaglia D, Blackman B, Peng XG. Coupled and decoupled dual quantum systems in one semiconductor nanocrystal. Journal of the American Chemical Society 127, 10889-10897 (2005).
Benninger RKP, Koc Y, Hofmann O, Requejo-Isidro J, Neil MAA, French PMW, Demello AJ.. Quantitative 3D mapping of fluidic temperatures within microchannel networks using fluorescence lifetime imaging. Anal Chem 78, 2272-2278 (2006).
Brites CDS, Lima PP, Silva NJO, Millan A, Amaral VS, Palacio F, Carlos LD. Thermometry at the nanoscale. Nanoscale 4, 4799-4829 (2012).
Cai ZP, Xiao L, Xu HY, Mortier M. Point temperature sensor based on green decay in an Er:ZBLALiP microsphere. J Lumines 129, 1994-1996 (2009).
Chen HY, Maiti S, Son DH. Doping Location-Dependent Energy Transfer Dynamics in Mn-Doped CdS/ZnS Nanocrystals. Acs Nano 6, 583-591 (2012).
Chen Y, Vela J, Htoon H, Casson JL, Werder DJ, Bussian DA, Klimov VI, Hollingsworth JA. "Giant" multishell CdSe nanocrystal quantum dots with suppressed blinking. Journal of the American Chemical Society 130, 5026-5027 (2008).
Choi CL, Li H, Olson Ack, Jain PK, Sivasankar S, Alivisatos AP. Spatially Indirect Emission in a Luminescent Nanocrystal Molecule. Nano Letters 11, 2358-2362 (2011).
Thou HL, Tseng CH, Pillai KC, Hwang BJ, Chen LY. Surface Related Emission in CdS Quantum Dots. DFT Simulation Studies. Journal of Physical Chemistry C 115, 20856-20863 (2011).
Clark SW, Harbold JM, Wise FW. Resonant energy transfer in PbS quantum dots. Journal of Physical Chemistry C 111, 7302-7305 (2007).
Dabbousi BO, Rodriguez-Viejo J, Mikulee FV, Heine JR, Mattoussi H, Ober R, Jensen KF, Bawendi AG. (CdSe)ZnS core-shell quantum dots: Synthesis and characterization of a size series of highly luminescent nanocrystallites. Journal of Physical Chemistry B 101, 9463-9475 (1997).
Danek M, Jensen KF, Murray CB, Bawendi MG. Synthesis of luminescent thin-film CdSe/ZnSe quantum dot composites using CdSe quantum dots passivated with an overlayer of ZnSe. Chemistry of Materials 8, 173-180 (1996).
Dennis AM, Mangum BD, Piryatinski A, Park YS, Hannah DC, Casson JL, Williams DJ, Schaller RD, HTOON H. Suppressed Blinking and Auger Recombination in Near-Infrared Type-II InP/CdS Nanocrystal Quantum Dots. Nano Letters 12, 5545-5551 (2012).
Deutsch Z, Schwartz O, Tenne R, Popovitz-Biro R, Oron D. Two-Color Antibunching from Band-Gap Engineered Colloidal Semiconductor Nanocrystals. Nano Letters 12, 2948-2952 (2012).
Dias EA, Grimes AF, English DS, Kambhampati P. Single dot spectroscopy of two-color quantum dot/quantum shell nanostructures. Journal of Physical Chemistry C 112, 14229-14232 (2008).
Galland C, Brovelli S, Bae WK, Padilha LA, Meinardi F, Klimov VI. Dynamic Hole Blockade Yields Two-Color Quantum and Classical Light from Dot-in-Bulk Nanocrystals. Nano Letters 13, 321-328 (2013).
Gosse C, Bergaud C, Loew P. Molecular Probes for Thermometry in Microfluidic Devices. In: Thermal Vanosystems and Nanomaterials Volz, S.: Ed.; Topic in Applied Physics; Springer-Verlag: Berlin, 301-341 (2009).
Graham EM, Iwai K, Uchiyama S, De Silva AP, Magennis SW, Jones AC. Quantitative mapping of aqueous microfluidic temperature with sub-degree resolution using fluorescence lifetime imaging microscopy. Lab on a Chip 10, 1267-1273 (2010).
Haro-Gonzalez P, Martinez-Maestro L, Martin IR, Garcia-Sole J, Jaque D. High-Sensitivity Fluorescence Lifetime Thermal Sensing Based on CdTe Quantum Dots. Small 8, 2652-2658 (2012).
Hsia CH, Wuttig A, Yang H. An Accessible Approach to Preparing Water-Soluble Mn2+-Doped (CdSSe)ZnS (Core)Shell Nanocrystals for Ratiometric Temperature Sensing. ACS Nano 5, 9511-9522 (2011).
Hyun BR, Zhong YW, Bartmik AD, Sun L, Abruna HD, Wise FW, Goodreau JD, Matthews JR, Leslie TM, Borrelli NF. Electron Injection from Colloidal PbS Quantum Dots into Titanium Dioxide Nanoparticles. Acs Nano 2, 2206-2212 (2008).
Ihly R, Tolentino J, Liu Y, Gibbs M, Law M. The Photothermal Stability of PbS Quantum Dot Solids. Acs Nano 5, 8175-8186 (2011).
Jaque D, Vetrone F. Luminescence nanothermometry. Nanoscale 4, 4301-4326 (2012).
Klimov VI. Spectral and dynamical properties of multilexcitons in semiconductor nanocrystals. In: Annual Review of Physical Chemistry 58, 635-673 (2007).
Kovalenko MV, Schaller RD, Jarzab D, Loi MA, Talapin DV. Inorganically Functionalized PbS-CdS colloidal Nanocrystals: Integration into Amorphous Chalcogenide Glass and Luminescent Properties. Journal of the American Chemical Society 134, 2457-2460 (2012).
Lakowicz JR, Gryczynski I, Gryczynski Z, Murphy CJ. Luminescence spectral properties of CdS Nanoparticles. Journal of Physical Chemistry B 103, 7613-7620 (1999).
Lee DC, Robel I, Pietryga JM, Klimov VI. Infrared-Active Heterostructured Nanocrystals with Ultra long Carrier Lifetimes. Journal of the American Chemical Society 132, 9960-9962 (2010).
Li Q, He Y, Chang J. Wang L, Chen H, Tan YW, Wang H, Shao Z. Surface-Modified Silicon Nanoparticles with Ultrabright

(56) References Cited

OTHER PUBLICATIONS

Photoluminescence and Single-Exponential Decay for Nanoscale Fluorescence Lifetime Imaging of Temperature. Journal of the American Chemical Society 135, 14924-14927 (2013).
Li S, Zhang K, Yang JM, Lin L, Yang H. Single quantum dots as local temperature markers. Nano Letters 7, 3102-3105 (2007).
Liang RZ, Tian R, Shi W, Kiu Z, Yan D, Wei M, Evans DG, Duan X. A Temperature sensor based on CdTe quantum dots-layered double hydroxide ultrathin films via layer-by-layer assembly. Chemical Communications 49, 969-971 (2013).
McLaurin EJ, Bradshaw LR, Gamelin DR. Dual-Emitting Nanoscale Temperature Sensors. Chemistry of Materials 25, 1283-1292 (2013).
Medintz IL, Uyeda HT, Goldman ER, Mattoussi H. Quantum dot bioconjugates for imaging, labelling and sensing. Nature Materials 4, 435-446 (2005).
Murayama M, Nakayama T. Chemical trend of band offsets at wurtzite/zinc-blende heterocrystalline semiconductor interfaces. Physical Review B 49, 4710-4724 (1994).
Nordin MN, Li JR, Clowes SK, Curry RJ. Temperature dependent optical properties of PbS nanocrystals. Nanotechnology 23, 275701 (2012).
Olkhovets A, Hsu RC, Lipovskii A, Wise FW. Size-dependent temperature variation of the energy gap in lead-salt quantum dots. Physical Review Letters 81, 3539-3542 (1998).
Pietryga JM, Werder DJ, Williams DJ, Casson JL, Schaller RD, Klimov VI, Hollingsworth JA. Utilizing the lability of lead selenide to produce heterostructured nanocrystals with bright, stable infrared emission. Journal of the American Chemical Society 130, 4879-4885 (2008).
Rao XT, Song T, Gao J, Cui Y, Yang Y, Wu C, Banglin C, Qian G. A Highly Sensitive Mixed Lanthanide Metal-Organic Framework Self-Calibrated Luminescent Thermometer. Journal of the American Chemical Society 135, 15559-15564 (2013).
Ryu E, Kim S, Jang E, Jun S, Jang H, Kim B Kim SW. Step-Wise Synthesis of InP/ZnS Core-Shell Quantum Dots and the Role of Zinc Acetate. Chemistry of Materials 21, 573-575 (2009).
Turyanska L, Patane A, Henini M, Hennequin B, Thomas NR. Temperature dependence of the photoluminescence emission from thiol-capped PbS quantum dots. Applied Physics Letters 90, 101913-101915 (2007).
Vetrone F, Naccache R, Zamarron A, Juarranz De La Fuente A, Sanz-Rodriguez F, Maestro LM Rodriguez EM Jaque D, Sole, JG, Capobianco JA. Temperature Sensing Using Fluorescent Nanothermometers. Acs Nano 4, 3254-3258 (2010).
Vlaskin VA, Janssen N, Van Rijssel J, Beaulac R, Gamelin DR. Tunable Dual Emission in Doped Semiconductor Nanocrystals. Nano Letters 10, 3670-3674 (2010).
Nang DF, Zhao HG, Wu NQ, El Khakani MA, Ma DL. Tuning the Charge-Transfer Property of PbS-Quantum Dot/TiO2-Nanobelt Nanohybrids via Quantum Confinement. Journal of Physical Chemistry Letters 1, 1030-1035 (2010).
Zhang T, Zhao HG, Riabinina D, Chaker M, Ma DL. Concentration-Dependent Photoinduced Photoluminescence Enhancement in Colloidal PbS Quantum Dot Solution. Journal of Physical Chemistry C 114, 10153-10159 (2010).
Zhao HG, Chaker M, Wu NQ, Ma DL. Towards controlled synthesis and better understanding of highly luminescent PbS/CdS core/shell quantum dots. Journal of Materials Chemistry 21, 8898-8904 (2011).
Zhao HG, Wang DF, Zhang T, Chaker M, Ma DL. Two-step synthesis of high-quality water-soluble near-infrared emitting quantum dots via amphiphilic polymers. Chemical Communications 46, 5301-5303 (2010).
Zhao H.; Liang, HY.; Gonfa, BA.; Chaker, M.; Ozaki, T.; Tijssen, P.; Vidal, F.; Ma, D. Investigating Photoinduced Charge Transfer in Double- and Single-Emission PbS@CdS Core@shell Quantum Dots. Nanoscale 6, 215-225 (2014).
Zhou D, Lin M, Liu X, Li J, Chen Z, Yao D, Sun H, Zhang H, Yang B. Conducting the Temperature-Dependent Conformational Change of Macrocyclic Compounds to the Lattice Dilation of Quantum Dots for Achieving an Ultrasensitive Nanothermometer. Acs Nano 7, 2273-2283 (2013).
Zhou D, Zhang H. Critical Growth Temperature of Aqueous CdTe Quantum Dots is Non-negligible for Their Application as Nanothermometers. Small 9, 3195-3197 (2013).
International Search Report, dated Sep. 3, 2015.
Written Opinion, dated Sep. 3, 2015.

* cited by examiner

NANOTHERMOMETER

CROSS-REFERENCE TO RELATED APPLICATIONS

This application is a National Entry Application of PCT application no PCT/CA2015/050703 filed on Jul. 27, 2015 and published in English under PCT Article 21(2), which itself claims benefit of U.S. provisional application Ser. No. 62/029,769, filed on Jul. 28, 2014. All documents above are incorporated herein in their entirety by reference.

FIELD OF THE INVENTION

The invention relates generally to nanothermometers. More specifically, the invention relates to semiconductor nanocrystals or quantum dots and their use as temperature sensors. The temperature sensor according to the invention is multi-parametric, self-calibrating ultrasensitive and/or biocompatible.

BACKGROUND OF THE INVENTION

Monitoring the local temperature at the nanoscale is fast becoming a critical task in, at least, three areas of nanoscience, i.e., micro/nano-electronics, integrated photonics and biomedicine, and nano-thermometry is attracting the increasing attention of the scientific community [1,2]. Precise measure of the temperature is extremely challenging, when using conventional techniques, due to insufficient contact between the thermometer and the object/area to be measured [1-4]. This issue could be addressed by using thermometers at the nanoscale, able to give high spatial resolution at sub-micrometer up to nanometer scale, real time temperature mapping and accurate and precise temperature response [1-8]. In the panorama of nanosized temperature probes [5-8], semiconductor nanoparticles or quantum dots (QDs) have emerged as competitive temperature sensor candidates due to their size-tunable optical properties, high quantum yield, good photostability and relatively facile synthesis methods [9-11]. They have shown their potential in nanoscale thermometry due to their temperature-dependent photoluminescence (PL) properties, such as PL intensity, PL peak position and lifetime [12-14]. Characteristic sensitivities in the range $0.1~0.3$ nm $K^{-1}$ were obtained by applying QDs, in agreement with theoretical calculations [12-14].

Variation in PL intensity and in PL peak position has been investigated in thermometric sensors [7,9,14-17]. However, the PL intensity/peak position of temperature sensors not only depends on the local temperature, but also on many other factors, such as the refractive index of the surrounding matrix/solution, the excitation or detection efficiency, the presence of quenching agents, like oxygen, moisture, etc. . . . [4].

Sensitivity of the PL temperature sensors to the above-mentioned changes in the local environment is difficult to be controlled in complex systems such as living cells or micro-devices, leading to inaccurate temperature measurements [15,18,19]. An appealing alternative is the use of double emitting systems, in which two emission bands at different wavelengths are simultaneously monitored. Accordingly, dual emission temperature sensors have been explored to overcome such problems [4].

Dual-emission QDs-based temperature sensors exhibit double luminescence from two excited states in the same QD. One or both of the two PL intensities change, when the temperature is varied. The temperature is typically measured from a ratio of the intensity of the two emission channels, instead of their absolute PL intensities, as in single-emission materials, endowing self-calibration of the system and increasing the robustness and reliability of intensity-based spectroscopy thermometry [13,20]. Vlaskin et al. [20] first reported a dual-emission temperature sensor by using $Mn^{2+}$ doped $Zn_{1-x}Mn_xSe/ZnCdSe$ core/shell QDs, based on a dual-emission from two excited states in thermal equilibrium. In a QD-based temperature sensor, several factors may affect the accuracy of the measurement, such as photobleaching and photoblinking under continuous illumination.

There is still a need for robust, accurate and precise temperature sensors at the nanoscale. Also, there is a need for such temperature sensors that operate in a wide temperature range.

SUMMARY OF THE INVENTION

The inventors have designed and developed a new semiconductor nanocrystal or quantum dot with dual-emission that can be used as temperature sensor. The temperature sensor is multi-parametric, self-calibrating ultrasensitive and/or biocompatible. Also the temperature sensor can operate in a wide temperature range.

In embodiments of the invention, the system is a PbS/CdS "giant" quantum dot system. The characteristic "giant" stems from a diameter of a quantum dot in the system. Indeed, the diameter is above about 10 nm, which is larger than a diameter of a typical QD known in the art, between about 2 and 6 nm [21].

In the above embodiments, the PbS/CdS core/shell "giant" QDs of the invention show two distinct emissions, a first emission in the near infrared (NIR) spectral region, at about 630 nm, which is assigned to the PbS core and a second emission in the visible region, at about 480 nm, and which is assigned to the CdS shell.

The ratio of photoluminescence (PL) intensity for the two emission bands, the lifetime of the PbS PL, and the peak position of the PbS PL each change with temperature. The response is explained by the different thermal-behavior of the PbS core and the CdS shell. More specifically, PL of the PbS core is strongly quenched at higher temperatures, it blue-shifts and its lifetime shortens, while CdS bulk-like emission is less affected by temperature changes.

In embodiments of the invention, variation of the temperature (T) results in a multi-parametric response of PL in the temperature range of about 150 to 373 K, with no need for any external calibration sources. The PbS core exhibits good photo-stability, benefiting from protection of the thick CdS shell, which allows for a more accurate measurement of the temperature.

In embodiments of the invention, for example when the quantum dots are capped with a material such as ZnS, the system is bio-compatible.

In embodiments of the invention, NIR PL can be finely tuned by adjusting the size of the core in the range of wavelength of useful transparency windows for bio-applications, for example between about 600 to 700 nm.

In embodiments of the invention, the lifetime of PbS PL is in the microsecond scale, which is relatively easy to be detected with standard detection methods, without the need of any nanoseconds sensitive detectors. Indeed, such lifetime is longer than a typical lifetime in a bio-chemical process, generally in the nanosecond scale. Accordingly, interferences between the two different PL sources are removed.

In embodiments of the invention, the QDs are versatile. For example they can be grafted to several nanometer sized systems by suitably tailoring the external ligand capping the shell.

The dual-emission "giant" core/shell QD-based thermal sensor according to the invention can be used as temperature sensor in living cells, microfluidics, electronic nano-devices and solid-state lasers for thermal high-resolution mapping.

The invention thus provides for the following according to aspects thereof:

(1) A semiconductor nanocrystal or quantum dot comprising a core made of a material and at least one shell made of another material.
(2) A semiconductor nanocrystal or quantum dot comprising a core made of a material and at least one shell made of another material, wherein a thickness of the at least one shell is greater than a thickness of the core.
(3) A semiconductor nanocrystal or quantum dot comprising a core made of a material that is photostable and at least one shell made of another material.
(4) A semiconductor nanocrystal or quantum dot comprising a core made of a material that is photostable and at least one shell made of another material, wherein a thickness of the at least one shell is greater than a thickness of the core.
(5) A semiconductor nanocrystal or quantum dot as defined in any one of (1) to (4), wherein the core is made of a material selected from PbS, PbSe, PbTe, InP, GaN, HgS and PbSxSe(1−x) wherein x is a number comprised between 0 and 1; preferably, the core is made of a material selected from PbS, PbSe, PbTe and PbSxSe(1−x) wherein x=; more preferably, the core is made of PbS.
(6) A semiconductor nanocrystal or quantum dot as defined in any one of (1) to (4), wherein the at least one shell is made of a material selected from CdS, CdSe, ZnS, ZnSe, ZnSxSe(1−x) wherein x is a number comprised between 0 and 1 and silica; preferably, the at least one shell is made of a material selected from CdS, ZnS, ZnSe and ZnSxSe(1−x) wherein x=; more preferably, the at least one shell is made of CdS.
(7) A semiconductor nanocrystal or quantum dot comprising a core made of PbS and at least one shell made of CdS.
(8) A semiconductor nanocrystal or quantum dot as defined in any one of (1) to (4), comprising two shells or more, each made of a different crystal form of the same material.
(9) A semiconductor nanocrystal or quantum dot as defined in any one of (1) to (4), comprising two shells or more, each made of a different material.
(10) A semiconductor nanocrystal or quantum dot as defined in any one of (1) to (4), comprising first and second shells, each made of a different crystal form of the same material.
(11) A semiconductor nanocrystal or quantum dot as defined in any one of (1) to (4), comprising first and second shells, each made of a different material.
(12) A semiconductor nanocrystal or quantum dot as defined in any one of (1) to (4), comprising three shells or more, at least two shells being made of a different crystal form of the same material.
(13) A semiconductor nanocrystal or quantum dot as defined in (12), wherein the two shells made of a different crystal form of the same material are consecutive shells.
(14) A semiconductor nanocrystal or quantum dot as defined in any one of (1) to (4), comprising first, second and third shells, wherein two of the three shells are made of a different crystal form of the same material and one shell is made of a different material.
(15) A semiconductor nanocrystal or quantum dot as defined in (10), wherein the two shells made of a different crystal form of the same material are consecutive shells.
(16) A semiconductor nanocrystal or quantum dot as defined in (14) or (15), wherein the third shell made of a different material is the external shell.
(17) A semiconductor nanocrystal or quantum dot as defined in any one of (1) to (16), further comprising an external ligand capping the at least one shell, wherein the external ligand is selected from oleic acid, oleylamine and 3-mercaptopropionic acid.
(18) A semiconductor nanocrystal or quantum dot as defined in any one of (1) to (17), wherein the core has a diameter of about 1-6 nm, preferably between about 1-4 nm, more preferably about 1.2 nm; and the at least one shell has a thickness of about 4-15 nm, preferably between about 3.5 to 8.5 nm, more preferably about 5 nm.
(19) A semiconductor nanocrystal or quantum dot as defined in any one of (1) to (18), which has a diameter of above 10 nm, preferably between about 10-30 nm, more preferably about 12 nm.
(20) A semiconductor nanocrystal or quantum dot as defined in any one of (1) to (19), which exhibits a double peaked photoluminescence emission when excited under about 400 nm visible light.
(21) A semiconductor nanocrystal or quantum dot as defined in any one of (1) to (20), which has excitation and emission properties in the near infrared (NIR).
(22) A semiconductor nanocrystal or quantum dot comprising a core made of PbS and at least one shell made of CdS, wherein a thickness of the at least one shell is greater than a thickness of the core.
(23) A semiconductor nanocrystal or quantum dot comprising a core made of PbS and two shells each made of a different crystal form of CdS, wherein a combined thickness of the two shells is greater than a thickness of the core.
(24) A semiconductor nanocrystal or quantum dot as defined in (23), wherein the crystal form of CdS is zinc-blende (ZB) or hexagonal wurtzite (WZ).
(25) A semiconductor nanocrystal or quantum dot as defined in (23) or (24), wherein the shell made of the ZB form is internal and the shell made of the WZ form is external.
(26) A semiconductor nanocrystal or quantum dot as defined in any one of (22) to (25), further comprising a third external shell made of ZnS.
(27) A composite comprising a plurality of semiconductor nanocrystals or quantum dots each being as defined in any one of (1) to (26).
(28) A composite according to (27), further comprising at least one suitable carrier and/or excipient selected from a solvent, a pharmaceutically acceptable carrier and mixtures thereof.
(29) A method of measuring the temperature of an object or area, comprising using a temperature sensor comprising a semiconductor nanocrystal or quantum dot as defined in any one of (1) to (26) or a composite as defined in (27) or (28).
(30) Use of a semiconductor nanocrystal or quantum dot as defined in any one of (1) to (26) or a composite as defined in (27) or (28), as a temperature sensor for measuring the temperature of an object or area.
(31) A method according to (29) or use according to (30), wherein measurement of the temperature is based on one or more of the following optical properties: quantum dot emission, peak shift, lifetime variation, double emission.

(32) A method according to (29) or use according to (30), wherein measurement of the temperature is based on all the following optical properties simultaneously: quantum dot emission, peak shift, lifetime variation, double emission.

(33) A method according to (29) or use according to (30), wherein the optical properties change with temperature, in a range of about 150 to 373 K.

(34) A method according to (29) or use according to (30), wherein the temperature sensor is multi-parametric, self-calibrating, ultrasensitive and/or biocompatible.

(35) A method according to (29) or use according to (30), which is in the field of biomedicine, micro/nano electronics or integrated photonics.

(36) A method according to (29) or use according to (30), wherein the object or medium relates to living cells, microfluids, electronic nano-devices or solid-state lasers.

(37) A method of preparing a semiconductor nanocrystal or quantum dot as defined in any one of (1) to (26), comprising conducting successive ionic layer absorption and reaction (SILAR) technique, over a number of cycle, the number of cycle being between 4 and 20, preferably between 4 and 10, more preferably 8.

Other objects, advantages and features of the present invention will become more apparent upon reading of the following non-restrictive description of specific embodiments thereof, given by way of example only with reference to the accompanying figures.

DESCRIPTION OF ILLUSTRATIVE EMBODIMENTS

Figure 1:
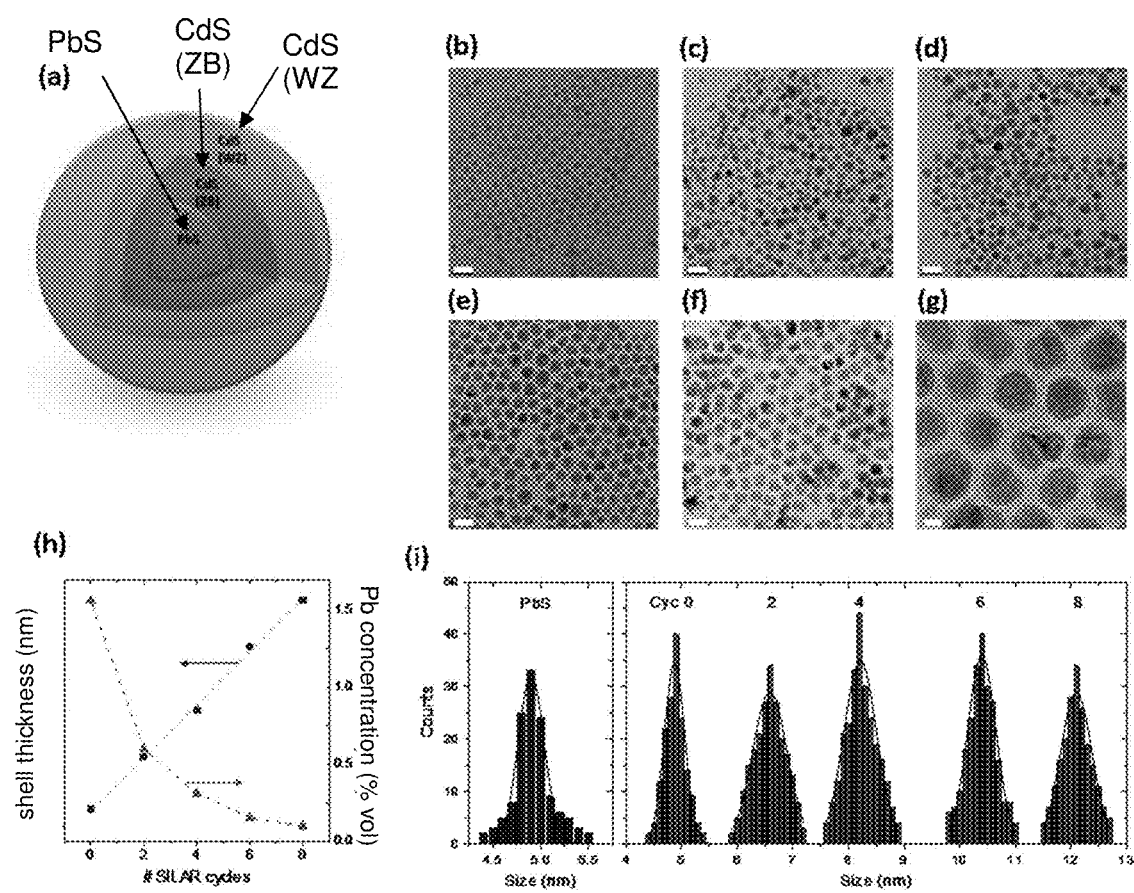
FIG. 1: (a) Scheme of the "giant" PbS/CdS QDs exhibiting a PbS core/CdS ZB shell/CdS WZ shell structure. (b)-(g): TEM. (b) Representative TEM images of parent PbS/CdS QDs after cation exchange, before SILAR. (c)-(g): PbS/CdS QDs after coating with 2 (c), 4 (d), 6 (e) and 8 (f) SILAR cycles. (g) HR-TEM image of sample (f). (h) Shell thickness and Pb volume concentration as a function of the number of SILAR cycles. (i) Size distribution of parent PbS QDs before cation exchange (blue) and of the core/shell QDs after different SILAR cycles. The solid lines are Gaussian fits of the experimental data.

Herein, the terms "semiconductor nanocrystal" and "quantum dot" are used interchangeably and are each intended to refer to particles that are small enough to exhibit quantum mechanical properties.

Herein, the term ""giant" quantum dot" is used to refer to a semiconductor nanocrystal and quantum dot that has a diameter of above about 10 nm.

Herein, the symbols "@" and "/" are used interchangeably and have the same meaning. For example, "PbS@CdS" and "PbS/CdS" both represent a semiconductor nanocrystal of quantum dot wherein the core is made of PbS and the shell is made of CdS.

Herein, the term "photostable" is used to refer to the ability of a material to remain unchanged upon exposure to light. In other words, the material does not change when it is exposed to light.

The invention provides for a semiconductor nanocrystal or quantum dot comprising a core made of a material and at least one shell made of another material. The material of which the core is made may be photostable; such material may be for example PbS, PbSe, PbTe, InP, GaN, HgS or PbSxSe(1−x) wherein x is a number comprised between 0 and 1. And the material of which the at least one shell is made may be for example CdS, CdSe, ZnS, ZnSe, ZnSxSe (1−x) wherein x is a number comprised between 0 and 1.

In embodiments of the invention, the various shells or at least two of the shells of the semiconductor nanocrystal or quantum dot may be made of a different material or of a different crystal form of the same material. In embodiments of the invention where there are two shells made of a different material or of a different crystal form of the same material, these shells may be consecutive. The semiconductor nanocrystal or quantum dot may further have an external ligand which is oleic acid, oleylamine or 3-mercaptopropionic acid.

In embodiments of the invention, the core may have a diameter between about 1-6 nm, preferably between about 1-4 nm, more preferably about 1.2 nm; and the at least one shell may have a thickness between about 4-15 nm, preferably between about 3.5 to 8.5 nm, more preferably about 5 nm. In other embodiments, the semiconductor nanocrystal or quantum dot may have a diameter of 10 nm or more, preferably between about 10-30 nm, more preferably about 12 nm.

The invention also provides for a composite comprising a plurality of the semiconductor nanocrystals or quantum dots each as defined above. In embodiments of the invention, the composite may further comprise at least one suitable carrier and/or excipient selected from a solvent, a pharmaceutically acceptable carrier and mixtures thereof.

Moreover, the invention provides for a method of measuring the temperature of an object or an area. The method comprises using a temperature sensor comprising the semiconductor nanocrystal or quantum dot as defined above. Such measurement is based on one or more or all of the following optical properties: quantum dot emission, peak shift, lifetime variation, double emission. In embodiments of the invention, the measurement is based on all these properties.

The method of the invention may be performed in the field of biomedicine, micro/nano electronics or integrated photonics. Measurement of temperature using the method of the invention may be performed on objects or media related to living cells, microfluids, electronic nano-devices or solid-state lasers.

The semiconductor nanocrystal or quantum dot of the invention and as defined above are prepared according to a method which comprises conducting successive ionic layer absorption and reaction (SILAR) technique, over a number of cycle, the number of cycle being between 4 and 20, preferably between 4 and 10, more preferably 8.

The invention is further described below with reference to the accompanying figures which are provided by way of example only.

Figure 2:
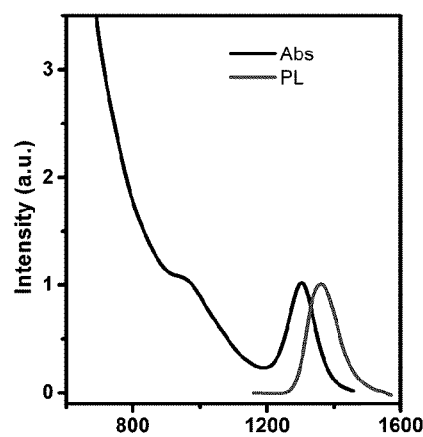
FIG. 2: Absorption and PL spectra of the PbS QDs which was used for synthesizing the PbS/CdS QDs via cation exchange.

PbS QDs were first synthesized via a hot injection method (FIG. 1(a)), and were subsequently used to synthesize core/shell QDs via a two-step cation exchange approach [10,22]. In general, the overall size of QDs does not change during the cation exchange process, while the PbS core shrinks [22]. Subsequently a CdS thick shell was overgrown by a successive ionic layer absorption and reaction (SILAR) method at 240° C. under $N_2$ flow [21,23]. Details on synthesis procedures are presented in herein below. The starting PbS/CdS core/shell QDs after cation exchange for synthesizing giant QDs show a PbS core of 1.2 nm in diameter with a 1.8 nm CdS shell, based on the overall diameter of core/shell QDs estimated from transmission electron microscopy (TEM) and Pb-to-Cd atomic ratio determined by inductively coupled plasma optical emission spectrometry (ICP-OES) [24]. After 8-cycle SILAR growth, particles size was increased to 12 nm, and shell thickness was around 5.4 nm (FIG. 1(b)). The starting PbS QDs show the first excitonic absorption peak of 1300 nm and the PL peak at 1360 nm (FIG. 2). After cation exchange, the PL peak shifts to ~690 nm due to the shrinking of the core (FIG. 1(c)) [22]. The dual emission starts appearing after 4-cycle CdS growth and we selected giant QDs after 8-cycle SILAR to be applied as nano-thermometers. The representative dual emission PL spectrum for giant QDs after 8 cycles is shown in FIG. 1c, in which two emission bands at 630 nm and 480 nm are visible after excitation at 400 nm.

Figure 3:
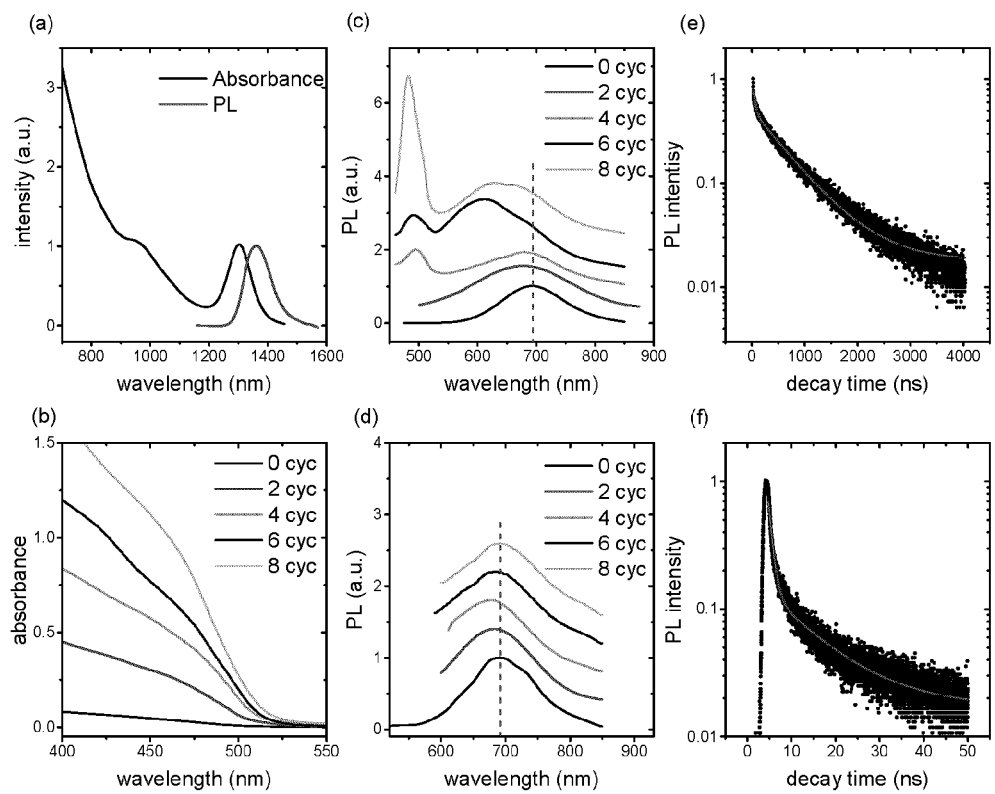
FIG. 3: (a) Absorption and PL spectra of the pure PbS QDs before cation exchange. Absorption (b) and PL (c and d) spectra of the PbS/CdS core/shell QDs after different cycles of CdS shell growth. The excitation position is set at 430 nm in (c) and 520 nm in (d). (e) and (f) Fluorescence decays of PbS/CdS QDs in toluene for sample Cyc 0 (e) and Cyc 4 (f). The emission position was fixed at (690±15) nm in (e) and at (480±7) nm in (f). The excitation wavelength is $\lambda_{ex}$=444 nm. The red curves are the fitting of the experimental data using a three-component exponential decay. The measurements were carried out at ambient temperature. All the samples have the same concentration for fair comparison of relative absorption and emission intensity.
Figure 4:
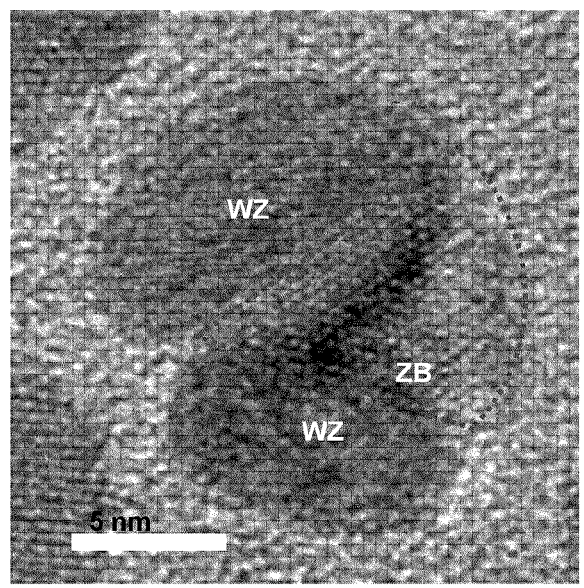
FIG. 4: HRTEM image of giant QDs with the mixture of ZB and WB crystal structures. In this HREM micrograph, apparently zinc blende crystal structure are observed in <110> projection. On the {111} faces of these cubic phase nuclei, wurtzite (WZ) grains are seen to grow on the left and right size of the central ZB seed.

We measured the lifetime of the two bands through transient PL spectrometry. We used a pulsed laser diode (excitation wavelength $\lambda_{ex}$=444 nm) and a multichannel scaling mode (MCS) or time-corrected single photon counting (TCSPC) set-up by focusing on emission at 630 nm (MCS mode) or 480 nm (TCSPC mode), respectively. The decay curves of the PL peaks centered at 630 nm and 480 nm were fitted by three-component decay (FIGS. 3(a) and 3(b)). The intensity-weighted average lifetime $<\tau>$ is estimated as follows [25,26]:

$$<\tau> = \frac{a_1\tau_1^2 + a_2\tau_2^2 + a_3\tau_3^2}{a_1\tau_1 + a_2\tau_2 + a_3\tau_3} \quad \text{Eq. 1}$$

In Equation 1, $a_i$ (i=1, 2, 3) are the coefficients of the fitting of PL decay and $\tau_i$ (i=1, 2, 3) are the characteristic lifetimes. The intensity-weighted average lifetime for emission at 630 nm in giant core/shell QDs dispersed in toluene is (0.86±0.03) µs (FIG. 3(a)). This result is consistent with the long lifetime of PbS/CdS QDs before SILAR (0 cyc, (0.96±0.03) µs) at the same emission wavelength. It is also in agreement with previously reported data for PbS QDs [22,25-28]. The average lifetime for emission at 480 nm is around 13-17 ns, in agreement with typical lifetimes for CdS QDs [29,30]. The emission peak at 480 nm (2.58 eV) is very narrow (peak width 25-35 nm), and it is very close to the reported band gap energy for the bulk wurtzite (WZ) phase of CdS (515 nm; 2.54 eV) [31-33]. We thoroughly investigated the origin of the double emission elsewhere [34] and concluded that emission peak at 480 nm should be assigned to the band edge emission of bulk-like CdS shell, while the 630 nm emission should be assigned to the PbS core [24]. The 630 nm emission blue shift after CdS coating might be related to the high temperature annealing of the PbS core during SILAR, similarly as in the "giant" QDs system of PbSe/CdSe/CdS core/shell/shell QDs [35].

Structure of the "Giant" Core/Shell QDs

In general, in core/shell structured QDs, the shell acts as energy barrier or as a chemical isolation layer for the core [10,22,27,36,37]. In most cases, the shell does not emit, due to the ultrafast non-radiative Auger recombination of the exciton after excitation [10,27,37,38]. Even for giant core/shell QDs, such as InP@CdS or core/shell/shell PbSe/CdSe/CdS QDs, a shell emission was not found [23,35]. In a few cases the double emission presented in core/shell system originates from the core and the shell, independently [22, 31,39-42], either due to the presence of an energetic barrier at the core/shell interface or due to the presence of spatially direct transition and spatially indirect emission [41]. For example Peng et al. [39] found double color emission in the CdSe/ZnS/CdSe core/shell/shell QDs, one from the CdSe core and the other one from the CdSe shell. Similar phenomenon was found in "dot-in-bulk" CdSe/CdS nanocrystals [31,40]. Limited results are reported in literature for double emission in PbS/CdS QDs [22,24], in which the emission in the visible range originates from CdS traps and the NIR one relates to the PbS bandgap due to the non-concentric spherical structure of core and shell, and no one reporting application of dual emitting QDs in the NIR.

Figure 5:
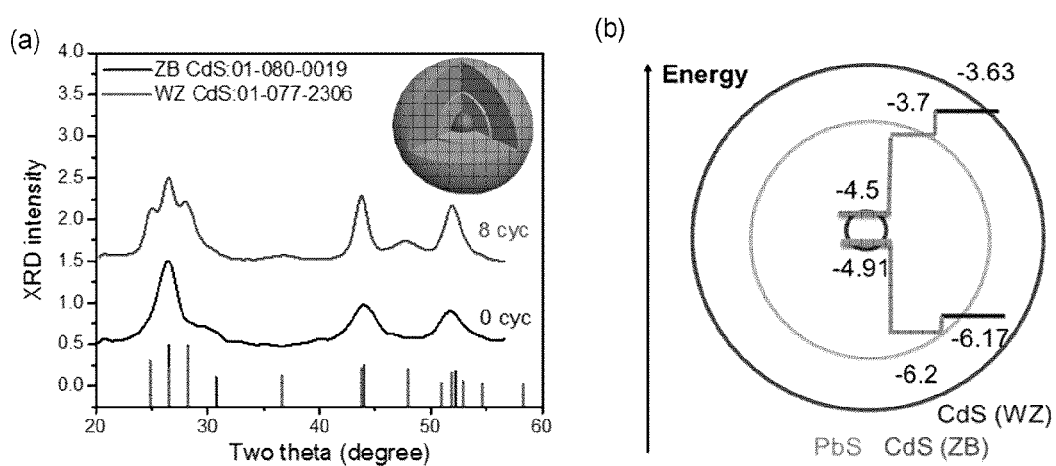
FIG. 5: (a) XRD patterns of PbS/CdS QDs after cation exchange (0 cycle) and after 8-cycles SILAR. The JCPDS card files for CdS (01 080 0019 (ZB), blue; 01-077-2306 (WZ), magenta line) are shown for identification. (b) Energy level diagram of bulk PbS and CdS with ZB structure and WZ structure. Inset in (a): a PbS/CdS QD which show a PbS core, an energetic barrier of ZB-structured CdS and an external WZ-structured CdS shell.

The XRD pattern of the core/shell nanocrystals (FIG. 5(a)) steadily shifts from a rock-salt to a mix of zinc-blende (ZB) CdS-like pattern and hexagonal wurtzite (WZ) CdS-like pattern after cation exchange and SILAR [31]. The final structure of the giant QDs is the following: there is no evidence of the PbS core in XRD, as it is expected, since the CdS content is 98.6% by volume after cation exchange (before SILAR). The external shell is composed by CdS hexagonal wurtzite (WZ), which is the typical phase for CdS growth in this temperature via SILAR [21,23,31], while a CdS ZB interface is formed between the core and the external shell, resulting in the final core/shell (CdS ZB)/shell (CdS WZ) structure illustrated in FIG. 5(a) (inset).

FIG. 5(b) shows the band offsets of the core/shell/shell bulk PbS/ZB/WZ. The modulation of the crystalline structure of the shell results in a peculiar potential landscape in the valence band, which exhibits an energetic barrier at the core/shell interface (FIG. 5(b)). A similar crystal structure has been found in dot-in-bulk CdSe/CdS QDs and this barrier was believed to induce the dual emission [31]. We proposed a similar mechanism for our system [34]. This energy barrier inhibits hole relaxation from the WZ CdS shell into the PbS core, leading to the emission from the CdS shell [31].

Figure 6:
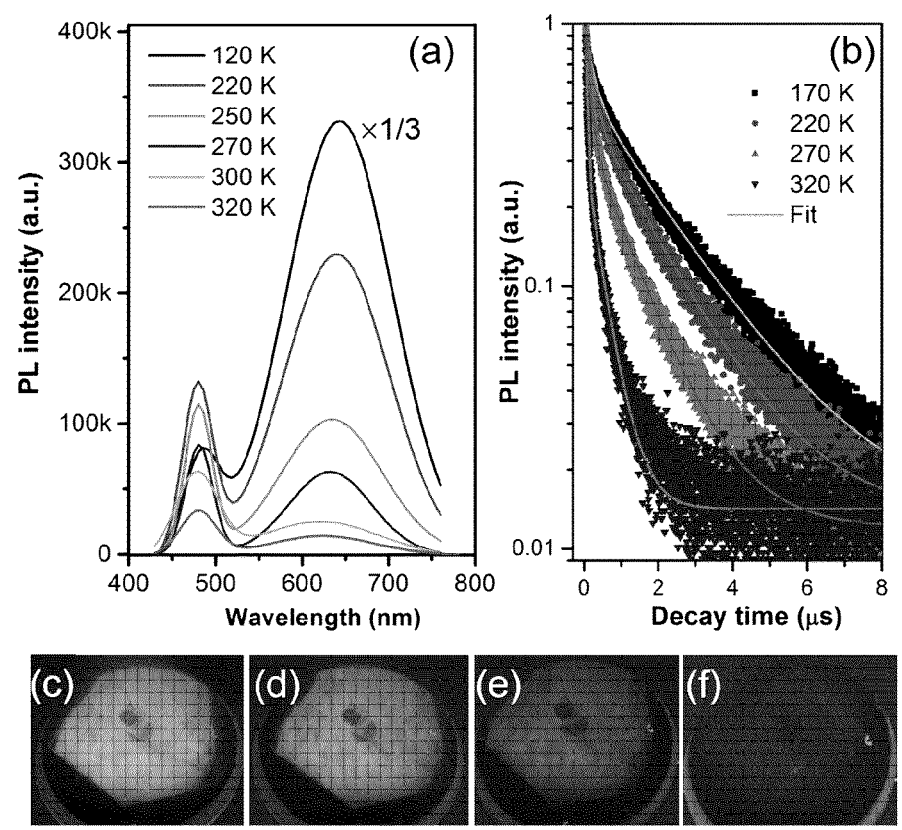
FIG. 6: (a) PL spectra of selected samples under 400 nm excitation at different temperatures. (b) PL decay curves of the PL peak at 630 nm at different temperatures. (c)-(f) Photographs of PbS/CdS QDs buried in PMMA matrix under UV lamp (254 nm, 4 W) at four different temperatures: (c) 120 K; (d) 220 K; (e) 300 K and (f) 373 K.
Figure 7:
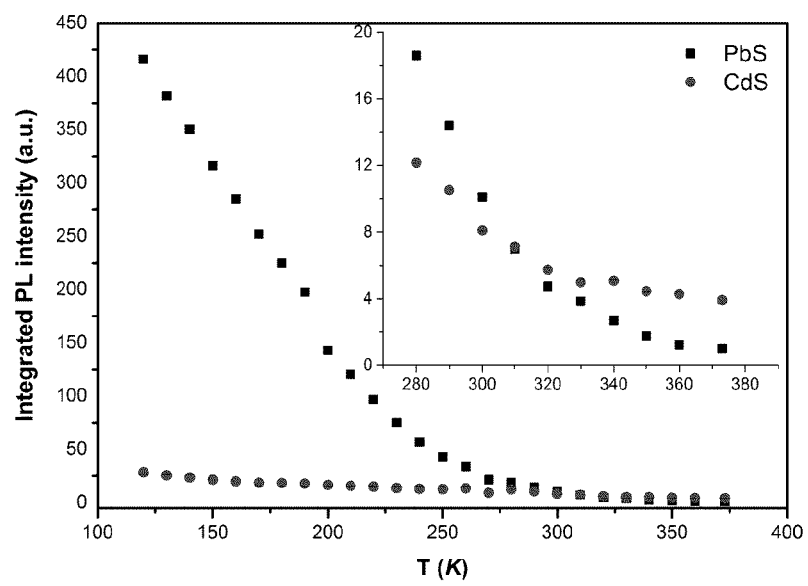
FIG. 7: Integrated PL intensity of emission peak of PbS (630 nm) and CdS (480 nm) in the "giant" PbS/CdS QDs as a function of temperature.

These colloidal "giant" QDs were subsequently mixed with poly(methyl methacrylate) (PMMA) and spin-coated or drop-dried on glass substrates for PL temperature-dependent measurements. QD concentration was kept low (1 μM) in the PMMA solution (6%) to avoid energy transfer between adjacent QDs that can affect the optical properties. FIG. 6(a) shows the evolution of the PL spectra of selected samples excited at 400 nm and in the temperature range from 120 K to 373 K. Temperature decrease systematically leads to an increase of PL intensity for both peaks (FIG. 6(a)), as expected, as is visually confirmed by the brightness of the samples under UV illumination (FIG. 6(c)-(f)). FIG. 7 displays the integrated PL intensity of the peaks at 630 nm and 480 nm versus temperature (T). The estimated PL enhancement of PbS is around 416 ($I_{150\,K}/I_{373K}$), while it is only around 7.2 for CdS, which explains the red-shift of the sample under UV irradiation at low T, as clearly visible in FIG. 6(c)-(f). In general, such temperature-induced increase of the integrated PL intensity in various types of QDs has been mainly attributed to the suppression of carrier trapping by defects/traps and the phonon-assisted thermal escape [43-45].

Figure 8:
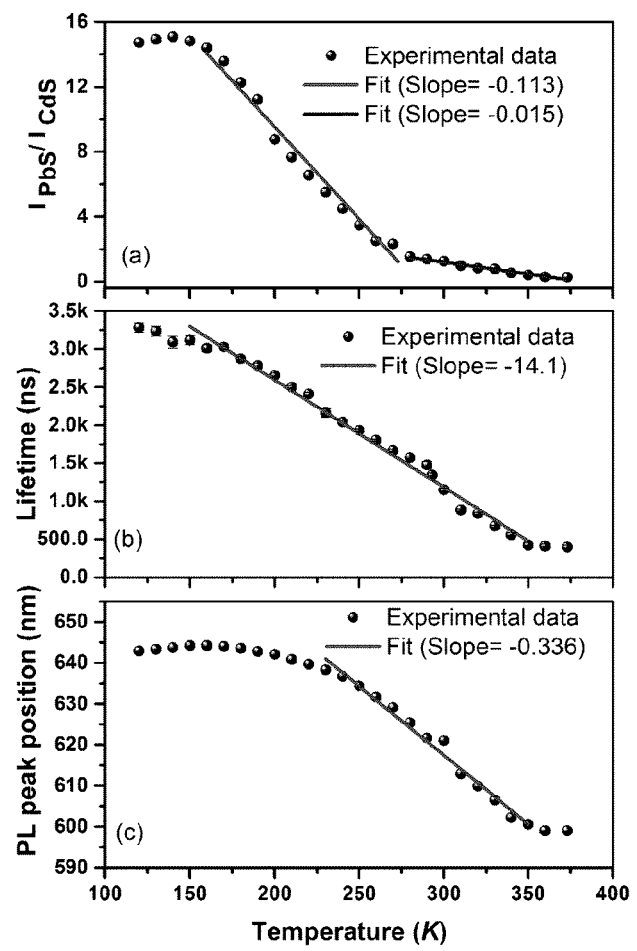
FIG. 8: (a) Temperature-dependent (a) intensity ratio ($I_{PbS}/I_{CdS}$), (b) lifetime and (c) PL peak of "giant" QDs and the fitted curve.

The PL double emission spectrum can be well fitted by a double Gaussian curve (typical $R^2$>0.98). The ratiometric response, $R=I_{PbS}/I_{CdS}$ is shown in FIG. 8(a), where I is the integrated PL intensity of PbS or CdS. PL of QDs in PMMA thin film is photostable for at least 3 hours (the duration of data collection in the investigated temperature interval). Three regions are clearly identified. (i) At low temperature, in the range 120-150 K, R keeps almost constant; (ii) in the range 150-280 K, R linearly varies with T with a slope of −0.113 $K^{-1}$; (iii) in the range 280-373 K, R is still linear with T, with a slope equal to −0.015 $K^{-1}$. The slope of the curve identifies the sensitivity of the thermometer and, ultimately, quantitatively determines its accuracy. The reduced slope in the higher temperature range might be explained by the surface/interface defects, which is very sensitive to high temperature (>100 degree), especially for PbS QDs. These results are comparable with the reported good sensitivity of Mn-doped QDs luminescence ratiometric thermometers in the literature, in which the maximum sensitivity typically falls in the range of $4.0\times10^{-3}$ to $9.0\times10^{-3}$ [13,20]. This indicates that dual emission "giant" QDs can be good luminescent thermometers in a wide temperature range with ultra-high sensitivity. In addition, this ratiometric thermometer does not need any additional calibration of PL intensity and thus transduction from the PL spectrum to the temperature values is straightforward, much faster than other types of solid luminescent thermometers.

Figure 9:
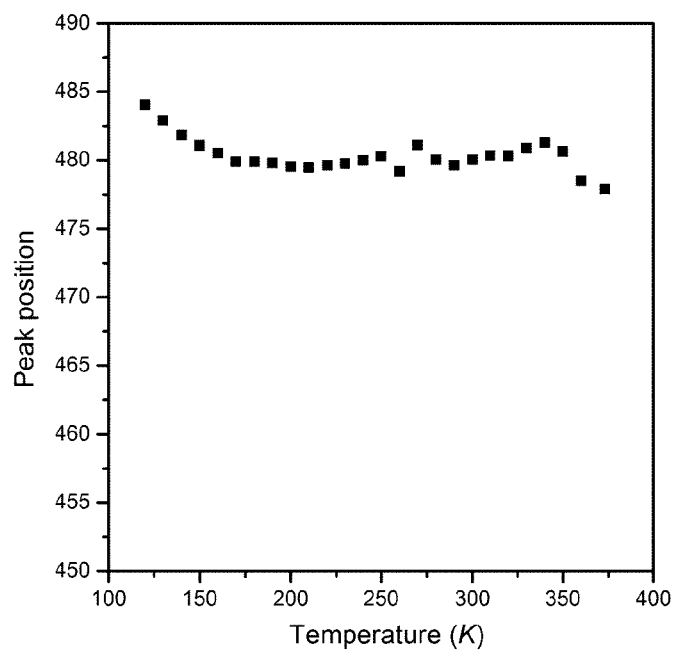
FIG. 9: PL peak evolution vs temperature.
Figure 10:
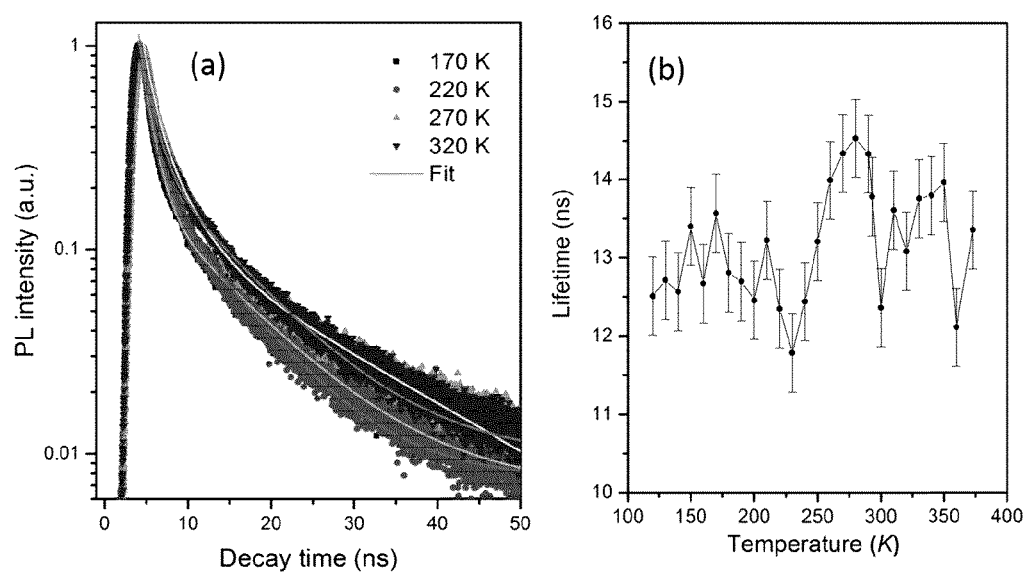
FIG. 10: (a) Typical PL decay curves for giant PbS@CdS QDs measured at the emission peak of 480 nm (CdS shell) in toluene with different temperature, shown on a logarithmic scale. (b) Lifetime of CdS emission (480 nm) as a function of temperature. The excitation wavelength was set at ~444 nm.

We investigated the lifetime and red-shift of both emission peaks as a function of T. The increase of lifetime and red-shift at decreasing T were only observed for the PbS peak at 630 nm (FIG. 8(a)-(b)). The CdS peak at 480 nm does not show a significant red-shift or increase of lifetime, most probably because the 480 nm emission is quite close to bulk emission, which is less sensitive to the temperature (FIGS. 9 and 10). PL decay of the PbS peak at 630 nm can be fitted by a three exponential in the temperature range between 120 to 373 K. The PL average lifetime estimated by Equation 1 increases as the temperature decreases (FIG. 8(b)) from (400±20) ns at 373 K to (3300±25) ns at 120 K. The lifetime varies linearly with the temperature and the slope of the curve is equal to −14.1 ns $K^{-1}$ in the range 150-350 K. Recently, several types of materials have been used for lifetime-based PL thermal sensors including dye, polymer, rare-earth and QDs [46-49]. Typically, a polymer shows a highest "normalized lifetime thermal coefficient", $\alpha_\tau$, which is defined as $\alpha_\tau = d[(\tau_T)/(\tau_{298})]/dT$,[1] where $\tau_T$ is the luminescence decay time at temperature T, which is as large as 0.06 $K^{-1}$ in polymers [48]. This $\alpha_\tau$ is larger than that of rare earth, dye or QDs, which is typical in the range of 0.01~0.03 $K^{-1}$ [46,47,49]. The estimated $\alpha_\tau$ for our QDs is around 0.013, comparable with the best reported $\alpha_\tau$ for CdTe QDs ($\alpha_\tau$ equal to 0.017 $K^{-1}$) [49]. Moreover, the lifetime of PbS QDs is in the range of several hundred ns to 3 μs. This range significantly differs from all the other kinds of PL lifetime sensors, being in the nanoseconds scale for dyes, polymer or UV-visible emitting QDs, and several tens μs to several ms in rare earth [46-49]. Accordingly, "giant" PbS/CdS QDs are promising luminescent probes for high resolution luminescence lifetime thermal imaging.

The temperature dependence of the PbS PL peak position is shown in FIG. 8(c). The blue-shift to shorter wavelengths as the temperature increases reflects the increase in the PbS QD energy band gap [44,45]. The temperature sensitivity is 0.336 nm $K^{-1}$ in the temperature range between 230 and 350 K, consistent with previously reported values for PbS QDs [44,45]. This sensitivity significantly overcomes the best reported value for β-thiolated cyclodextrin-decorated CdTe QDs of 0.28 nm $K^{-1}$ [14]. The emission peak shift of QDs has dominant contributions from lattice dilatation and electron-phonon interactions [50]. The high PL peak position temperature response is attributed to the larger thermal expansion of PbS with respect to the CdS, CdSe or CdTe, which have very small intrinsic lattice thermal expansion coefficient [14,51].

In Table 1 we report the characteristic features of the PL double emission in the various temperature ranges, which allow the exploitation of multi-parametric temperature detection, being two-parametric in the 150-230 K range, and three-parametric in the 230-373 K interval.

TABLE 1

Characteristic sensitivity of the three different features of PL double emission applied for temperature sensing: $I_{PbS}/I_{CdS}$, lifetime of the PbS band and peak shift of the PbS band.

| | T range (K) | Ratiometric ($K^{-1}$) | Lifetime ($\alpha_\tau$ $K^{-1}$) | Peak shift (nm $K^{-1}$) | Optical properties | Reference |
|---|---|---|---|---|---|---|
| "Giant" QDs | 150-230 | −0.113 | 0.013* | / | Double emission | Present invention |
| "Giant" QDs | 230-280 | −0.113 | 0.013* | 0.336** | Double emission | Present invention |
| "Giant" QDs | 280-350 | −0.015 | 0.013* | 0.336** | Double emission | Present invention |
| "Giant" QDs | 350-373 | −0.015 | / | / | Double emission | Present invention |
| $Zn_{1-x}Mn_xSe/ZnCdSe$ QDs | 100-400 | 0.009 | / | / | Double emission | [13] |
| $Tb_{1-x}Eu_xPlA$ | 100-300 | 0.035~0.20 | / | / | Double emission | [6] |
| CdTe QDs | 238-363 | / | / | 0.28 | Single emission | [14] |
| CdTe QDs | 300-323 | / | 0.017 | / | Single emission | [49] |
| Polymer | 300-315 | / | 0.06 | / | Single emission | [48] |

*Lifetime of the PbS NIR band centered at 630 nm at RT.
**Peak shift of the PbS NIR band centered at 630 nm at RT.

The added value of a multi-parametric temperature detection relies with the possibility of obtaining independent estimate of the temperature from weakly correlated variables, such as, in the present case, the ratio of two PL emissions, the lifetime of a single band or its peak shift with respect to a reference temperature. Under these conditions, it is easier to obtain an estimate of the presence of potential systematic errors, and give a reasonable and quantitative evaluation of the accuracy of the measurement. As it can be seen in Table 1, the system under investigation is the only one allowing multi-parametric temperature measurement in the broadest temperature range and with among the highest sensitivities for each of the applied methodologies.

Figure 11:
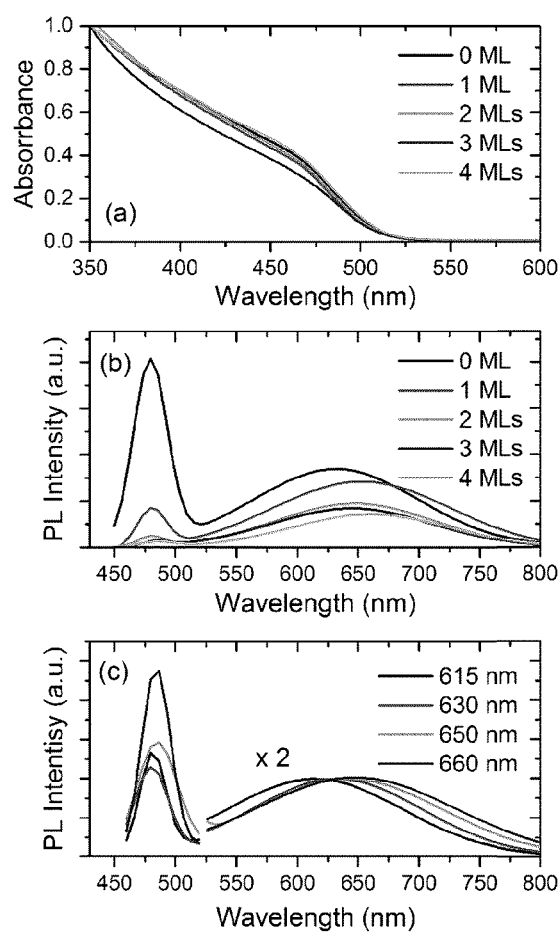
FIG. 11: Absorption (a) and PL spectra (b) of PbS/CdS "giant" QDs covered by increasing number of ZnS MLs, from 0 to 4. (c) PL spectra of PbS/CdS "giant" QDs in which PbS core size is varied to tune the PL emission peak position in the NIR. The legend indicates the position of the maximum of the NIR peak.

In addition, we demonstrate that these systems can be suitably prepared for biological applications and that the emission features in the NIR region can be finely tuned to match the desired transparency windows. Capping of QDs with a ZnS shell is a standard methodology to physically insulate the core of the system, and to endow application of these QDs in biosystems. FIGS. 11(a) and (b) report the absorbance of "giant" QDs before and after coating with increasing number (up to 4) of ZnS monolayers (ML). Absorbance is almost unaffected by the presence of ZnS, while PL suffer significant modifications. In particular, CdS emission is strongly quenched by the presence of ZnS, the quenching being proportional to the number of ZnS ML, while lower reduction on PbS PL intensity is visible. Quenching is of course detrimental for temperature measurement, because it decreases the sensitivity and the accuracy of the measurement, accordingly.

Optimum number of ZnS shell exists (2 or 3) for keeping the possibility of ratiometric temperature measurement, above which CdS PL emission is quenched.

Furthermore, we demonstrate the tunability of PbS PL emission in the 615-660 nm range by simply modulating the PbS core size (FIG. 11(c)). As will be understood by a skilled person, this feature allows tuning of the excitation and emission properties in the NIR, which is relevant for investigation of bio-systems, which presents transparency windows in this frequency range.

Figure 12:
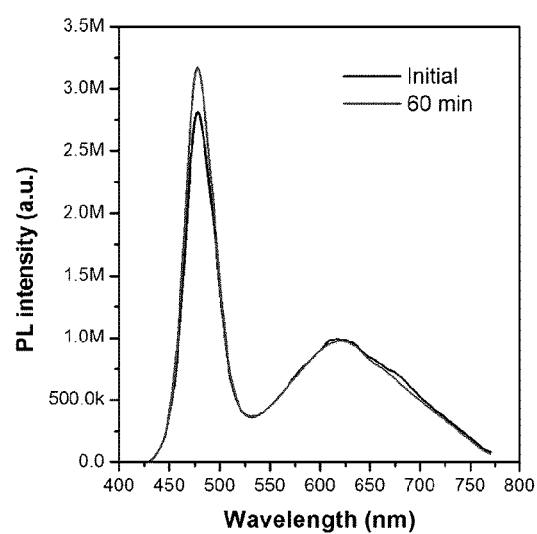
FIG. 12: PL spectra of the giant PbS/CdS QDs before and after UV illumination (254 nm, 4 W).
Figure 13:
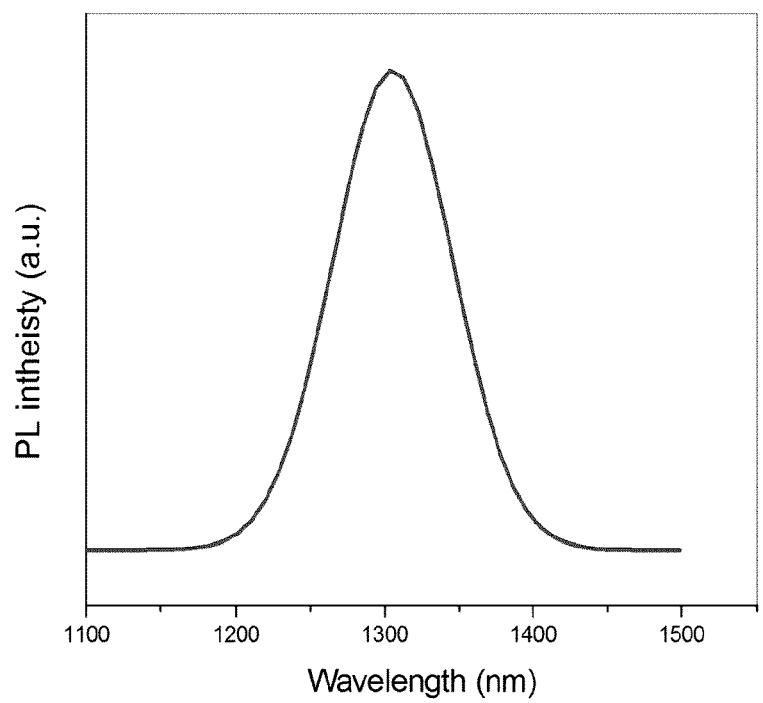
FIG. 13: Reprehensive PL spectrum of PbS/CdS QDs in water. The QDs was capped by Mercaptopropionic acid (MPA).
Figure 14:
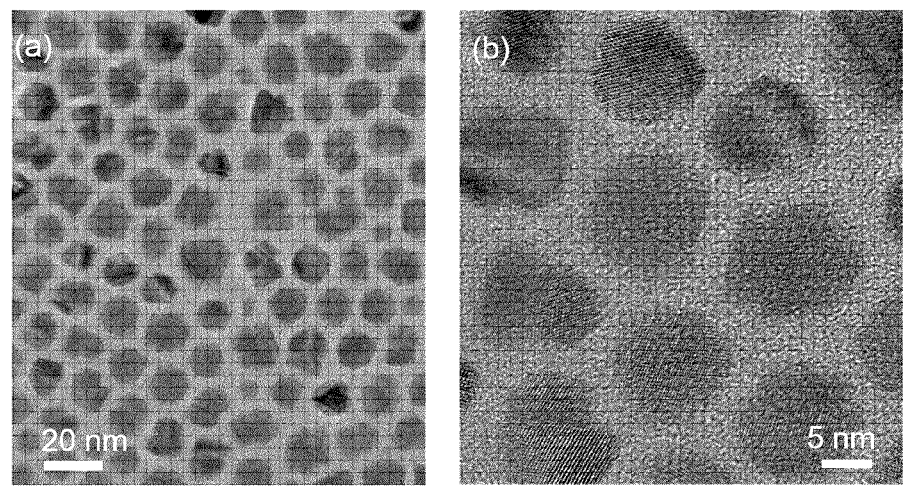
FIG. 14: Representative TEM and HR-TEM images of PbS/CdS QDs after coated with 3-cycle of ZnS via SILAR.
Figure 15:
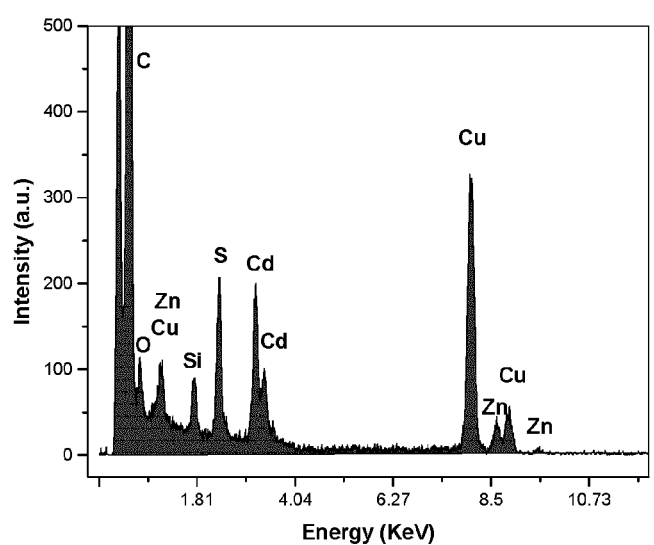
FIG. 15: E-DEX spectrum of PbS/CdS QDs after coated with 3-cycle of ZnS via SILAR, which confirming the presence of Zn after ZnS coating.

Two additional advantages presented by these "giant" core/shell QDs are the reproducibility of the preparation procedure and their long-term stability. The synthesis of "giant" core/shell PbS/CdS QDs is highly reproducible by carefully controlling the reaction parameters, such as the reaction time and temperature, the precursor injection rate and the other experimental parameters. The stability of giant QDs is good in toluene: the PL peaks position and intensity do not show any significant change after storing at 4° C. for at least five months. A slight increase of PL intensity for the CdS band (at 480 nm) was observed after 60 min illumination by UV light, due to photo-activation (FIG. 12). The position and intensity of the PbS peak (at 630 nm) does not show any significant change after illumination, testifying the photo-stability of PbS core due to the protection of the thick CdS shell (FIG. 7) [52]. The thick CdS shell can confer the super-photo-stability of PbS core due to the protection of the thick CdS shell (FIG. 12, with respect to the PL quenchers, photo-induced blenching or blinking, similarly to thick-shell "giant" CdSe/CdS QD or "giant" InP/CdS QD counterparts [21,23].

As will be understood by a skilled person, we described the synthesis, characterization and PL properties of dual-emitting multi-parametric optical temperature sensors based on thin films of "giant" core/shell PbS/CdS QDs. The "giant" QDs show dual emission originating from the rock-salt PbS core (in the NIR) and the WZ CdS shell (in the visible), due to the presence of an energy barrier between the core and the shell, composed of ZB CdS. Three parameters of the dual emission can be simultaneously recorded, namely: the ratio of PbS and CdS PL bands, the lifetime of the PbS band and its PL peak shift, allowing a multi-parametric temperature measure in a large temperature range, 150-350 K. The ratiometric sensitivity reaches −0.113 $K^{-1}$ in the range 150-280 K and the lifetime sensitivity reaches 14.1 ns $K^{-1}$ in the range 150-350 K. The ultra-high sensitivity of the measurement and the multi-parametric platform ensure an accurate measurement of the temperature.

Based on the stability of the "giant" PbS/CdS QDs and their linear response to temperature change, the achieved high sensitivity makes them promising for high resolution lifetime mapping. In addition, they are promising for bio-lifetime imaging, due to their long lifetime (in the µs scale), which is longer than the lifetime of background organic tissue (ns), thus yielding a high signal/noise ratio [53]. These "giant" QDs can be further covered by a ZnS shell that enables application of these nanostructures in bio-systems. Furthermore, these QDs are versatile and can be grafted to several nanometer sized systems by suitably tailoring the external ligand capping the shell. The system also allows for modulation of NIR emission. For example this is demonstrated for an optical window from 615 to 660 nm, but, based on typical emission wavelengths of PbS core/shell QDs [54], it is expected the possibility of tailoring PL emission down to 1500 nm and below.

As will be understood by a skilled person, benefiting from the multi-parametric temperature probe, high sensitivity and good stability, the inventors have developed "giant" QDs that are robust and can be used in nanoscale thermometry. Also, the "giant" QDs of the invention can be used in novel thermal mapping in complex environments at the sub-microscale or nanoscale range.

Water Soluble PbS or PbS/CdS QDs

To further use the QDs as thermometer in the bio-system, the QDs were transferred in to water via the phase-transfer approach. Detailed information is provided below.

Methods

Materials:

Lead chloride (98%), sulfur (100%), oleylamine (OLA) (technical grade, 70%), cadmium oxide (99%), zinc acetate dihydrate (98%), oleic acid (OA), PMMA, chloroform and octadecene (ODE) were obtained from Sigma-Aldrich Inc. Hexane, toluene, dimethyl sulfoxide and ethanol were purchased from Fisher Scientific Company. All chemicals were used as purchased.

Example 1—Synthesis of PbS QDs

PbS QDs were synthesized by using OLA or OA as ligands [22]. Typically, $PbCl_2$ (3.6 mmol) in OLA (2.4 mL) and sulfur (0.36 mmol) in OLA (0.24 mL) were purged, respectively, by $N_2$ at room temperature for 30 min. The $PbCl_2$-OLA suspension was heated to 160° C. and kept at this temperature for 1 hour. The $PbCl_2$-OLA suspension was cooled to 120° C. under vacuum for 15 min. The flask was then reopened and the $N_2$ flux was restored. Sulfur in OLA at room temperature was quickly injected into the $PbCl_2$-OLA suspension under vigorous stirring. The reaction cell was quenched with cold water after the growth reaction was conducted at 100° C. for 1 min to obtain PbS QDs. Ethanol was added, and then the suspension was centrifuged and supernatant was removed. The QDs were dispersed in toluene.

Example 2—Synthesis of PbS@CdS QDs

PbS/CdS QDs were synthesized via a cation exchange method [8-10]. Typically, CdO (2.3 mmol), OA (2 mL) and ODE (10 mL) were heated to 255° C. under $N_2$ for 20 min. The clear solution was cooled to 155° C. under vacuum for 15 min. The flask was then reopened and the $N_2$ flux was restored. PbS QDs suspension in toluene (1 mL, Absorbance=3 at the first absorption exciton peak) was diluted in 10 mL toluene, bubbled for 30 min. and then heated to 100° C. immediately. The Cd/OA mixture was injected. The reaction cell was quenched with cold water after the growth reaction was conducted at 100° C. for different time. PbS/CdS QDs were precipitated with ethanol and then re-dispersed in chloroform. The typical shell thickness is around ~0.6-0.8 nm. PbS/CdS QDs with a thick shell were synthesized via a two-step cation exchange procedure [22]. In the first step, PbS/CdS QDs with a thin shell were synthesized via a cation exchange method [22]. Typically, CdO (2.3 mmol), OA (2 mL) and ODE (10 mL) were heated to 255° C. under $N_2$ for 20 min. The clear solution was cooled to 155° C. under vacuum for 15 min. The flask was then reopened and the $N_2$ flux was restored. PbS QDs suspension in toluene (1 mL, Absorbance=3 at the first exciton peak) was diluted in 10 mL toluene, bubbled for 30 min and then heated to 100° C.~150° C. immediately. The Cd/OA mixture was injected. The reaction cell was quenched with cold water after the growth reaction was conducted at 100° C. for 4 hours. In the second step, without any purification, the reaction temperature was further increased to 240° C. and the reaction was allowed to proceed for 2 hours. The reaction was quenched by injection of cold toluene (−20° C.). Ethanol was added, and then the suspension was centrifuged and supernatant was removed. The QDs were dispersed in toluene.

Example 3—Synthesis of "Giant" PbS/CdS QDs

Deposition of CdS layer on PbS/CdS QDs followed the procedure described in Dennis et al. [23]. Typically, in a 100 mL round-bottom flask, OLA (5 ml), ODE (3 mL) and PbS/CdS QDs (7 mg in toluene) were degassed at 110° C. for 20 min. The reaction flask was re-stored with $N_2$ and the temperature was further raised to 240° C. with stirring. The sulfur dispersed in ODE (1 mL, 0.2 M) was added dropwise and the mixture allowed to react for 90 min., followed by dropwise addition of 1 mL 0.2 M $Cd(OA)_2$ in ODE. The shell was further annealed for 120 min. All subsequent shells were annealed at 240° C. for ~1.5 h following the injection of the sulfur and ~2 h following dropwise addition of the $Cd(OA)_2$ in ODE. Sulfur/$Cd(OA)_2$ addition volumes for shell addition cycles 1-8 were as follows: 1, 1, 1.5, 1.5, 2, 2, 3, and 3 mL, respectively. The reaction was quenched by injection of cold toluene (−20° C.). Ethanol was added, and then the suspension was centrifuged and supernatant was removed. The QDs were dispersed in toluene or chloroform. For further growth of the ZnS layers, the S precursor in ODE (0.04 M) was was added dropwise and the mixture allowed to react for 30 min., followed by adding Zn precursor ($Zn(OA)_2$, 0.04 M) dropwise [39]. The Zn and S were allowed to react for up to 60 min. before another layer of ZnS was applied. Between 1 and 4 monolayers of ZnS were grown for this study.

Example 4—QD Film Preparation

The QDs chloroform solution was mixed with PMMA in chloroform and then spin-coated or drop dried on the glass substrate. The concentration of QDs in this mixture solution is around 1 µM and the concentration of polymer was 6 wt %.

Example 5—Synthesis of Water-Soluble QDs

The pbs or pbs/cds particles capped with oleic acid in toluene were reconstituted in 5.0 mL of 1-methyl-2-pyrrolidinone (NMP) for water solubilization. In a 50 mL round bottom flask 3.0 mmol of butylamine 4.6 mmol of 3-mercaptopropionic acid (3-MPA) were added to 10.0 mL of NMP and heated while stirring to 100° C. using the oil bath under the protection of $N_2$. The solution was then allowed to cool to room temperature, after which the particle solution was added. This solution was well sealed then heated to 70° C. holding that temperature for 30 min. The QDs were then extracted three times with hexanes and precipitated with toluene. Precipitated particles were dried under vacuum and resuspended in 1× phosphate buffered saline (PBS). The sample show very good stability. The QY can reach to as high as 20% in PBS.

Characterizations:

QDs were characterized by a JEOL 2100F TEM. The Pb/Cd ratio was measured by using inductively coupled plasma optical emission spectrometry (ICP-OES) (Perkin Elmer Model Optima 7300 DV). The small angle XRD study of extensively purified PbS or PbS/CdS QDs was carried out with a Philips X'pert diffractometer using Cu Kα radiation source (λ=0.15418 nm).

Absorption spectra were acquired with a Cary 5000 UV-Vis-NIR spectrophotometer (Varian) with a scan speed of 600 nm/min. Fluorescence spectra were taken with a Fluorolog®-3 system (Horiba Jobin Yvon).

PL lifetime of PbS cores in PbS/CdS nanocrystals was measured using a pulsed laser diode of 444 nm and fast multichannel scaler mode in the Fluorolog®-3 system. PL lifetime of the CdS shell was measured in the time-correlated single-photon counting (TCSPC) mode with a 444 nm laser.

The temperature-dependent optical properties of QDs were measured in the PMMA matrix in the temperature range of 120-373 K by monitored the variation of their PL spectra or lifetime with temperature using THMS 600 temperature controlled stages. Each measurement is taken at a given temperature following a 5 min. equilibration period.

Although the present invention has been described hereinabove by way of specific embodiments thereof, it can be modified, without departing from the spirit and nature of the subject invention as defined in the appended claims.

The present description refers to a number of documents, the content of which is herein incorporated by reference in their entirety.

REFERENCES

1. Jaque D, Vetrone F. Luminescence nanothermometry. *Nanoscale* 4, 4301-4326 (2012).
2. Brites C D S, et al. Thermometry at the nanoscale. *Nanoscale* 4, 4799-4829 (2012).
3. Allison S W, Gillies G T. Remote thermometry with thermographic phosphors: Instrumentation and applications. *Review of Scientific Instruments* 68, 2615-2650 (1997).
4. McLaurin E J, Bradshaw L R, Gamelin D R. Dual-Emitting Nanoscale Temperature Sensors. *Chemistry of Materials* 25, 1283-1292 (2013).
5. Barilero T, Le Saux T, Gosse C, Jullien L. Fluorescent Thermometers for Dual-Emission-Wavelength Measurements: Molecular Engineering and Application to Thermal Imaging in a Microsystem. *Anal Chem* 81, 7988-8000 (2009).
6. Rao X T, et al. A Highly Sensitive Mixed Lanthanide Metal-Organic Framework Self-Calibrated Luminescent Thermometer. *Journal of the American Chemical Society* 135, 15559-15564 (2013).
7. Li Q, et al. Surface-Modified Silicon Nanoparticles with Ultrabright Photoluminescence and Single-Exponential Decay for Nanoscale Fluorescence Lifetime Imaging of Temperature. *Journal of the American Chemical Society* 135, 14924-14927 (2013).
8. Albers A E, Chan E M, McBride P M, Ajo-Franklin C M, Cohen B E, Helms B A. Dual-Emitting Quantum Dot/Quantum Rod-Based Nanothermometers with Enhanced Response and Sensitivity in Live Cells. *Journal of the American Chemical Society* 134, 9565-9568 (2012).
9. Li S, Zhang K, Yang J-M, Lin L, Yang H. Single quantum dots as local temperature markers. *Nano Letters* 7, 3102-3105 (2007).
10. Pietryga J M, et al. Utilizing the lability of lead selenide to produce heterostructured nanocrystals with bright, stable infrared emission. *Journal of the American Chemical Society* 130, 4879-4885 (2008).
11. Dabbousi B O, et al. (CdSe)ZnS core-shell quantum dots: Synthesis and characterization of a size series of highly luminescent nanocrystallites. *Journal of Physical Chemistry B* 101, 9463-9475 (1997).
12. Chen H-Y, Maiti S, Son D H. Doping Location-Dependent Energy Transfer Dynamics in Mn-Doped CdS/ZnS Nanocrystals. *Acs Nano* 6, 583-591 (2012).
13. Hsia C-H, Wuttig A, Yang H. An Accessible Approach to Preparing Water-Soluble Mn2+-Doped (CdSSe)ZnS (Core)Shell Nanocrystals for Ratiometric Temperature Sensing. *Acs Nano* 5, 9511-9522 (2011).
14. Zhou D, et al. Conducting the Temperature-Dependent Conformational Change of Macrocyclic Compounds to the Lattice Dilation of Quantum Dots for Achieving an Ultrasensitive Nanothermometer. *Acs Nano* 7, 2273-2283 (2013).
15. Vetrone F, et al. Temperature Sensing Using Fluorescent Nanothermometers. *Acs Nano* 4, 3254-3258 (2010).
16. Liang R Z, et al. A temperature sensor based on CdTe quantum dots-layered double hydroxide ultrathin films via layer-by-layer assembly. *Chemical Communications* 49, 969-971 (2013).
17. Zhou D, Zhang H. Critical Growth Temperature of Aqueous CdTe Quantum Dots is Non-negligible for Their Application as Nanothermometers. *Small* 9, 3195-3197 (2013).
18. Medintz I L, Uyeda H T, Goldman E R, Mattoussi H. Quantum dot bioconjugates for imaging, labelling and sensing. *Nature Materials* 4, 435-446 (2005).
19. Gosse C, Bergaud C, Loew P. Molecular Probes for Thermometry in Microfluidic Devices. In: *Thermal Nanosystems and Nanomaterials* Volz, S.: Ed.; Topic in Applied Physics; Springer-Verlag: Berlin, 301-341 (2009).
20. Vlaskin V A, Janssen N, van Rijssel J, Beaulac R, Gamelin D R. Tunable Dual Emission in Doped Semiconductor Nanocrystals. *Nano Letters* 10, 3670-3674 (2010).
21. Chen Y, et al. "Giant" multishell CdSe nanocrystal quantum dots with suppressed blinking. *Journal of the American Chemical Society* 130, 5026-5027 (2008).
22. Zhao H G, Chaker M, Wu N Q, Ma D L. Towards controlled synthesis and better understanding of highly luminescent PbS/CdS core/shell quantum dots. *Journal of Materials Chemistry* 21, 8898-8904 (2011).
23. Dennis A M, et al. Suppressed Blinking and Auger Recombination in Near-Infrared Type-II InP/CdS Nanocrystal Quantum Dots. *Nano Letters* 12, 5545-5551 (2012).
24. Zhao H G L, H. Y.; Gonfa, B. A.; Chaker, M.; Ozaki, T.; Tijssen, P.; Vidal, F.; Ma, D. Investigating Photoinduced Charge Transfer in Double- and Single-Emission PbS@CdS Core@shell Quantum Dots. *Nanoscale* 6, 215-225 (2014).
25. Hyun B R, et al. Electron Injection from Colloidal PbS Quantum Dots into Titanium Dioxide Nanoparticles. *Acs Nano* 2, 2206-2212 (2008).
26. Wang D F, Zhao H G, Wu N Q, El Khakani M A, Ma D L. Tuning the Charge-Transfer Property of PbS-Quantum Dot/TiO2-Nanobelt Nanohybrids via Quantum Confinement. *Journal of Physical Chemistry Letters* 1, 1030-1035 (2010).
27. Zhao H G, Wang D F, Zhang T, Chaker M, Ma D L. Two-step synthesis of high-quality water-soluble near-infrared emitting quantum dots via amphiphilic polymers. *Chemical Communications* 46, 5301-5303 (2010).
28. Clark S W, Harbold J M, Wise F W. Resonant energy transfer in PbS quantum dots. *Journal of Physical Chemistry C* 111, 7302-7305 (2007).
29. Chou H L, Tseng C H, Pillai K C, Hwang B J, Chen L Y. Surface Related Emission in CdS Quantum Dots. DFT Simulation Studies. *Journal of Physical Chemistry C* 115, 20856-20863 (2011).
30. Lakowicz J R, Gryczynski I, Gryczynski Z, Murphy C J. Luminescence spectral properties of CdS nanoparticles. *Journal of Physical Chemistry B* 103, 7613-7620 (1999).
31. Galland C, Brovelli S, Bae W K, Padilha L A, Meinardi F, Klimov V I. Dynamic Hole Blockade Yields Two-Color Quantum and Classical Light from Dot-in-Bulk Nanocrystals. *Nano Letters* 13, 321-328 (2013).
32. Murayama M, Nakayama T. Chemical trend of band offsets at wurtzite/zinc-blende heterocrystalline semiconductor interfaces. *Physical Review B* 49, 4710-4724 (1994).
33. Bandic Z Z, Ikonic Z. Electronic structure of (Zn,Cd)(S,Se)-based polytype superlattices. *Physical Review B* 51, 9806-9812 (1995).
34. Zhao H, Sirigu G, Rossi M Z, Rosei F, Vomiero A. in preparation.
35. Lee D C, Robel I, Pietryga J M, Klimov V I. Infrared-Active Heterostructured Nanocrystals with Ultra long Carrier Lifetimes. *Journal of the American Chemical Society* 132, 9960-9962 (2010).
36. Ryu E, et al. Step-Wise Synthesis of InP/ZnS Core-Shell Quantum Dots and the Role of Zinc Acetate. *Chemistry of Materials* 21, 573-575 (2009).
37. Danek M, Jensen K F, Murray C B, Bawendi M G. Synthesis of luminescent thin-film CdSe/ZnSe quantum dot composites using CdSe quantum dots passivated with an overlayer of ZnSe. *Chemistry of Materials* 8, 173-180 (1996).
38. Klimov V I. Spectral and dynamical properties of multiexcitons in semiconductor nanocrystals. In: *Annual Review of Physical Chemistry* 58, 635-673 (2007).
39. Battaglia D, Blackman B, Peng X G. Coupled and decoupled dual quantum systems in one semiconductor nanocrystal. *Journal of the American Chemical Society* 127, 10889-10897 (2005).
40. Deutsch Z, Schwartz O, Tenne R, Popovitz-Biro R, Oron D. Two-Color Antibunching from Band-Gap Engineered Colloidal Semiconductor Nanocrystals. *Nano Letters* 12, 2948-2952 (2012).
41. Choi C L, Li H, Olson A C K, Jain P K, Sivasankar S, Alivisatos A P. Spatially Indirect Emission in a Luminescent Nanocrystal Molecule. *Nano Letters* 11, 2358-2362 (2011).
42. Dias E A, Grimes A F, English D S, Kambhampati P. Single dot spectroscopy of two-color quantum dot/quantum shell nanostructures. *Journal of Physical Chemistry C* 112, 14229-14232 (2008).
43. Ihly R, Tolentino J, Liu Y, Gibbs M, Law M. The Photothermal Stability of PbS Quantum Dot Solids. *Acs Nano* 5, 8175-8186 (2011).
44. Nordin M N, Li J R, Clowes S K, Curry R J. Temperature dependent optical properties of PbS nanocrystals. *Nanotechnology* 23, 275701 (2012).
45. Turyanska L, Patane A, Henini M, Hennequin B, Thomas N R. Temperature dependence of the photoluminescence emission from thiol-capped PbS quantum dots. *Applied Physics Letters* 90, 101913-101915 (2007).
46. Cai Z P, Xiao L, Xu H Y, Mortier M. Point temperature sensor based on green decay in an Er:ZBLALiP microsphere. *J Lumines* 129, 1994-1996 (2009).
47. Benninger R K P, et al. Quantitative 3D mapping of fluidic temperatures within microchannel networks using fluorescence lifetime imaging. *Anal Chem* 78, 2272-2278 (2006).
48. Graham E M, Iwai K, Uchiyama S, de Silva A P, Magennis S W, Jones A C. Quantitative mapping of aqueous microfluidic temperature with sub-degree resolution using fluorescence lifetime imaging microscopy. *Lab on a Chip* 10, 1267-1273 (2010).
49. Haro-Gonzalez P, Martinez-Maestro L, Martin I R, Garcia-Sole J, Jaque D. High-Sensitivity Fluorescence Lifetime Thermal Sensing Based on CdTe Quantum Dots. *Small* 8, 2652-2658 (2012).
50. Olkhovets A, Hsu R C, Lipovskii A, Wise F W. Size-dependent temperature variation of the energy gap in lead-salt quantum dots. *Physical Review Letters* 81, 3539-3542 (1998).
51. Kovalenko M V, Schaller R D, Jarzab D, Loi M A, Talapin D V. Inorganically Functionalized PbS—CdS Colloidal Nanocrystals: Integration into Amorphous Chalcogenide Glass and Luminescent Properties. *Journal of the American Chemical Society* 134, 2457-2460 (2012).
52. Zhang T, Zhao H G, Riabinina D, Chaker M, Ma D L. Concentration-Dependent Photoinduced Photoluminescence Enhancement in Colloidal PbS Quantum Dot Solution. *Journal of Physical Chemistry C* 114, 10153-10159 (2010).
53. Aswathy R G, Yoshida Y, Maekawa T, Kumar D S. Near-infrared quantum dots for deep tissue imaging. *Analytical and Bioanalytical Chemistry* 397, 1417-1435 (2010).
54. Zhao H, al e. *Nanoscale*, Under revision.

The invention claimed is:

1. A dual-emission semiconductor nanocrystal or quantum dot comprising a core made of a material, and two shells or more each made of a different crystal form of another material,
   wherein the dual-emission semiconductor nanocrystal or quantum dot exhibits a double peaked photoluminescence emission when excited under about 400 nm visible light; and/or the dual-emission semiconductor nanocrystal or quantum dot has excitation and emission properties in the near infrared (NIR).

2. The dual-emission semiconductor nanocrystal or quantum dot as defined in claim 1, wherein a combined thickness of the shells is greater than a thickness of the core.

3. The dual-emission semiconductor nanocrystal or quantum dot of claim 1, wherein the core is made of a material that is photostable.

4. The dual-emission semiconductor nanocrystal or quantum dot of claim 1, wherein the core is made of a material selected from the group consisting of PbS, PbSe, PbTe, InP, GaN, HgS, and PbSxSe(1−x) wherein x is a number comprised between 0 and 1; and wherein the shell is made of a material selected from the group consisting of CdS, CdSe, ZnS, ZnSe, ZnSxSe(1−x) wherein x is a number comprised between 0 and 1, and silica.

5. The dual-emission semiconductor nanocrystal or quantum dot of claim 1, comprising first and second shells, each made of a different crystal form of the same other material.

6. The dual-emission semiconductor nanocrystal or quantum dot of claim 1, comprising three shells or more, wherein at least two shells are made of a different crystal form of the same other material, and the two shells made of a different crystal form of the same other material are consecutive shells.

7. The dual-emission semiconductor nanocrystal or quantum dot of claim 1, comprising first, second and third shells, wherein two of the three shells are made of a different crystal form of the same other material and one shell is made of a different material, and the third shell made of a different material is the external shell.

8. The dual-emission semiconductor nanocrystal or quantum dot of claim 1, further comprising an external ligand capping the shells, wherein the external ligand is selected from the group consisting of oleic acid, oleylamine and 3-mercaptopropionic acid.

9. The dual-emission semiconductor nanocrystal or quantum dot of claim 1, wherein the core has a diameter of about 1-6 nm; and each shell has a thickness of about 4-15 nm.

10. The dual-emission semiconductor nanocrystal or quantum dot of claim 1, which has a diameter of above 10 nm.

11. A composite comprising a plurality of dual-emission semiconductor nanocrystals or quantum dots each being as defined in claim 1.

12. A method of measuring the temperature of an object or area, comprising using the composite as defined in claim 11.

13. A method of measuring the temperature of an object or area, comprising using a temperature sensor comprising the dual-emission semiconductor nanocrystal or quantum dot as defined in claim 1, wherein measurement of the temperature is based on an optical property which is: quantum dot emission, peak shift, lifetime variation, double emission, or a combination thereof.

14. A method of measuring the temperature of an object or area, comprising using a temperature sensor comprising the dual-emission semiconductor nanocrystal or quantum dot as defined in claim 1, wherein:
the optical property changes with temperature, in a range of about 150 to 373 K; and/or
the temperature sensor is multi-parametric, self-calibrating, ultrasensitive and/or biocompatible; and/or
the object or medium relates to living cells, microfluids, electronic nano-devices or solid-state lasers; and/or
the method is in the field of biomedicine, micro/nano electronics or integrated photonics.

15. A method of preparing the dual-emission semiconductor nanocrystal or quantum dot as defined claim 1, comprising conducting successive ionic layer absorption and reaction (SILAR) technique, over a number of cycle, the number of cycle being between 4 and 20.

16. A dual-emission semiconductor nanocrystal or quantum dot comprising a core made of PbS and two shells each made of a different crystal form of CdS,
wherein a combined thickness of the two shells is greater than a thickness of the core,
and wherein the dual-emission semiconductor nanocrystal or quantum dot exhibits a double peaked photoluminescence emission when excited under about 400 nm visible light; and/or the dual-emission semiconductor nanocrystal or quantum dot has excitation and emission properties in the near infrared (NIR).

17. The dual-emission semiconductor nanocrystal or quantum dot of claim 16, wherein the crystal form of CdS is zinc-blende (ZB) or hexagonal wurzite (WZ).

18. The dual-emission semiconductor nanocrystal or quantum dot of claim 16, wherein the crystal form of CdS is zinc-blende (ZB) or hexagonal wurzite (WZ), and wherein the shell made of the ZB form is internal and the shell made of the WZ form is external.

* * * * *